United States Patent
Wallace, Jr. et al.

(10) Patent No.: US 6,933,800 B2
(45) Date of Patent: Aug. 23, 2005

(54) PRINTED CIRCUIT SUPPRESSION OF HIGH-FREQUENCY SPURIOUS SIGNALS

(75) Inventors: Douglas Elmer Wallace, Jr., Austin, TX (US); Stephanus Saputro, Austin, TX (US)

(73) Assignee: Dell Products L.P., Round Rock, TX (US)

(*) Notice: Subject to any disclaimer, the term of this patent is extended or adjusted under 35 U.S.C. 154(b) by 221 days.

(21) Appl. No.: 09/931,229

(22) Filed: Aug. 16, 2001

(65) Prior Publication Data

US 2003/0034855 A1 Feb. 20, 2003

(51) Int. Cl.$^7$ ................................................ H04B 3/28
(52) U.S. Cl. ........................... 333/12; 327/382; 327/565
(58) Field of Search ............................. 333/12; 327/382, 327/565

(56) References Cited

U.S. PATENT DOCUMENTS

| | | | | |
|---|---|---|---|---|
| 4,888,568 A | * | 12/1989 | Kawaguchi | 333/174 |
| 5,717,359 A | * | 2/1998 | Matsui et al. | 333/12 X |
| 6,016,084 A | * | 1/2000 | Sugimoto | 333/12 |
| 6,061,222 A | * | 5/2000 | Morris et al. | 257/533 X |
| 6,075,211 A | * | 6/2000 | Tohya et al. | 174/255 |
| 6,104,258 A | * | 8/2000 | Novak | 333/22 R |
| 6,448,873 B1 | * | 9/2002 | Mostov | 333/185 |

\* cited by examiner

Primary Examiner—Robert Pascal
Assistant Examiner—Kimberly Glenn
(74) Attorney, Agent, or Firm—Hamilton & Terrile, LLP; Robert W. Holland

(57) ABSTRACT

In electronic equipment, such as, for example, a personal computer printed circuit board, an arrangement for mitigating EMI, noise and other spurious signals at high frequencies. The arrangement includes a discrete capacitor coupled between an active pad and a reference pad. A conductor is coupled to the discrete capacitor and is configured to include a serpentine trace and a terminating tuning capacitance that are effectively series resonant at a predetermined frequency. In an exemplary embodiment, the serpentine trace comprises a number of substantially linear, mutually parallel segments that are joined by turns. The length and width of the serpentine trace, together with the number and spacing of linear segments, cooperates with the geometry of the tuning capacitance to determine the frequency of maximum attenuation of spurious signals.

38 Claims, 4 Drawing Sheets

PRINTED CIRCUIT SUPPRESSION OF HIGH-FREQUENCY SPURIOUS SIGNALS

BACKGROUND OF THE INVENTION

1. Field of the Invention

The invention relates to techniques for the attenuation of noise and/or the suppression of electromagnetic interference (EMI) in electronic equipment that includes, but is not limited to, personal computers (PCs). More particularly, the invention relates to an embellishment to a circuit arrangement that incorporates a discrete bypass capacitor and series-resonant impedance for noise attenuation and/or EMI suppression at frequencies above, for example, 100 MHz.

2. Description of the Related Art

Computer systems in general, and personal computer (PC) systems in particular, have attained widespread use in providing computer power to many segments of modem society. A conventional PC system can usually be defined as a desktop, floor standing, or portable microcomputer that includes a system unit having a system processor and associated volatile and non-volatile memory, display monitor, a keyboard, one or more diskette drives, a fixed disk storage device and an optional printer.

PC systems may be considered information handling systems that are designed primarily to provide independent computing power either to a single user or to a relatively small group of users, as in the case of personal computers that serve as computer server systems. Accordingly, such systems are intended to be inexpensively priced for purchase by individuals or small businesses. A PC system may also include one of a plurality of peripheral or I/O devices that are coupled to the system processor and that perform specialized functions. Examples of I/O devices include modems, sound and video devices or specialized communication devices. Mass storage devices, such as hard disks, CD-ROM drives and magneto-optical drives, are also considered to be peripheral devices. Computers producing multi-media effects, i.e., sound coupled with visual images, are in increased demand as computers become used for artistic endeavors, for entertainment, and for education. In addition, the use of sound makes game playing more realistic and helps reinforce knowledge and make educational programs more enjoyable to use. Digital effects and music can also be created on the computer and played through attached speakers without the need for additional musical instruments or components.

A significant consideration in the design and fabrication of compact (and therefore densely assembled) PCs and other high-speed digital equipment is the need to minimize the effects of ringing, crosstalk, radiated noise and other forms of electromagnetic interference (EMI). However, design approaches seeking to minimize EMI effects are generally unsusceptible to straightforward circuit analysis. In fact, although entire textbooks have been devoted to techniques for combating EMI, the subject continues to be viewed as "black magic". See, for example, Howard Graham, *High-Speed Digital Design*, Prentice Hall PTR (1993).

High-speed digital circuits and systems frequently draw large transient currents during short intervals, when, for example, logic circuits and devices change state. Often logic transitions take place with brief rise and fall times, under the control of increasingly high-frequency clock signals. Because realizable voltage sources for digital circuitry are characterized by series resistances and inductances, bypass and decoupling capacitors are commonly relied on to supply transient current requirements during transition intervals. The coupling capacitors are typically electrically connected between a voltage supply and ground and serve to mitigate the effects of the nonzero voltage supply source impedance. The decoupling capacitors, therefore, tend to maintain the output of the voltage supply by providing a significant portion of the transient current.

However, the ability of commercially available capacitors to supply current at high frequencies is limited by the parasitic lead inductance that is characteristic of such capacitors. In addition to the inductance associated with capacitor leads, the finite inductance of each via that may be used, for example, to attach a power supply plane to a ground plane introduces a small, but measurable inductance.

Accordingly, U.S. patent Ser. No. 09/491,290, *Digital Circuit Decoupling for EMI Reduction*, filed Jan. 25, 2000, by Jeffery C. Hailey and Todd W. Steigerwald, assigned to the same assignee as is this Application (hereby incorporated in its entirely for all purposes), addresses EMI that is related to bypass capacitors themselves, and particularly addresses EMI that results from the inductance that is inherent is commercially available, discrete bypass and decoupling capacitors. That Patent Application discloses a printed circuit board assembly in which at least two decoupling capacitors are used to decouple (to ground) transient currents that result from, for example, logic transitions in high-speed digital circuitry. The decoupling capacitors are physically arranged, and electronically connected between a power plane and a ground plane, so that transient currents flow in respectively opposite directions through the capacitors, thereby maximizing the capacitors' mutual inductance, and thus minimizing the EMI generated by the capacitors.

It may be properly inferred from the above, that it is widely appreciated in the design a manufacturer of compact and densely populated electronic equipment, such as personal computers, that attenuation of spurious noise signals and EMI is a significant system design consideration. As personal computers become more compactly packaged, and as the data and/or clock rates at which PCs operate continue to escalate, the generation of and susceptibility to high-frequency signals (e.g., signals at 100 MHz and above) similarly exacerbate. A certain degree of noise rejection and EMI suppression is conventionally achieved by judicious placement of discrete bypass capacitors between points on significant signal or voltage paths and ground. To the extent that the impedance of the bypass capacitor tends to approximate zero at high frequencies of interest, the noise or EMI at these frequencies can be suppressed or attenuated by coupling these signals through the bypass capacitor to ground.

However, the electrical characteristics of commercially available bypass capacitors that may be obtained at pragmatic prices deviate markedly from those of an "ideal" capacitor. Accordingly, because of equivalent series inductances and resistances, the magnitude of the impedance of standard capacitors may actually increase with frequency. Nevertheless, the non-ideal nature of such capacitors may be exploited. That is, a commercially available ceramic chip capacitor having a nominal value of $0.1\ \mu f$ provides effective bypass at 10 MHz, but may also exhibit series resonance at, say, 100 MHz or above. As a result, a particular chip capacitor part may be empirically selected to provide effective bypass at one range frequencies and, because of stray capacitance and/or inductance, to present resonance at a frequency of interest, which may be, for example, the clock rate of the PC, or a harmonic thereof. Unfortunately, as the clock frequencies and data rates that are encountered in PC design rise, discrete capacitors that exhibit a "parasitic" series resonance at frequencies of interest have not appeared to be readily available.

Accordingly, what is desired is a circuit technique that may be used in conjunction with commercially available discrete bypass capacitors to provide suppression and attenuation of noise and EMI a frequencies above about 100 MHz. The technique must be cost-effective and compatible with existing constraints applicable to printed circuit board arrangement and PC packaging.

SUMMARY OF THE INVENTION

The above and other objects, advantages and capabilities are achieved in one aspect of the invention by a printed circuit board that comprises a first conductive pad, a second conductive pad, a capacitive element connected between the first and the second conductive pads, and a series-resonant impedance coupled to the first pad. The series-resonant impedance comprises a serpentine conductor and a tuning capacitance.

In another aspect, the invention resides in a computer system that comprises a printed circuit board and at least one integrated circuit device mounted on the printed circuit board wherein the integrated circuit device has a significant frequency, $F_o$. An active conductor is coupled to the integrated circuit device and a reference conductor is coupled to the integrated circuit device. A first pad is coupled to the active conductor and a second pad is coupled to the reference conductor. A capacitor is coupled between the first pad and the second pad. Means coupled to the capacitor and comprising a serpentine conductor and a tuning capacitance operates to attenuate signals at $F_o$.

In an additional aspect, the invention may be exploited in a method of suppressing spurious signals in electronic equipment. The method comprises affixing a discrete capacitor to a printed circuit board (PCB) between a power pad and a reference pad. An inductance is deposited on the PCB so that one end of the inductance is coupled to the power pad. A second end of the inductance is coupled to a tuning capacitance. The inductance and tuning capacitance are dimensioned to be series resonant at a predetermined frequency at which spurious signals are expected to be encountered.

In a further aspect, the invention may be manifest in various forms of electronic equipment by a circuit for attenuating spurious signals at high frequencies. The circuit includes a power pad and a reference pad, which reference pad may be part of, or connected to, a ground plane. A discrete capacitor is coupled between the power pad and the reference pad. A printed circuit LC network is connected to the power pad and is coupled to the ground plane. The LC network, which is resonant at the frequency of a predetermined spurious signal, comprises: a capacitive element; a plurality of substantially linear segments; an originating segment coupling a first linear segment to the power pad; a terminating segment coupling a second linear segment to the capacitive element; and a turn coupling two adjacent linear segments.

BRIEF DESCRIPTION OF THE DRAWINGS

The present invention may be better understood, and it's numerous objects, features and advantages made apparent to those skilled in the art with reference to accompanying Drawings, in which use of the same reference number throughout the figures of the Drawing designates the same or a similar element and in which.

Figure 1:
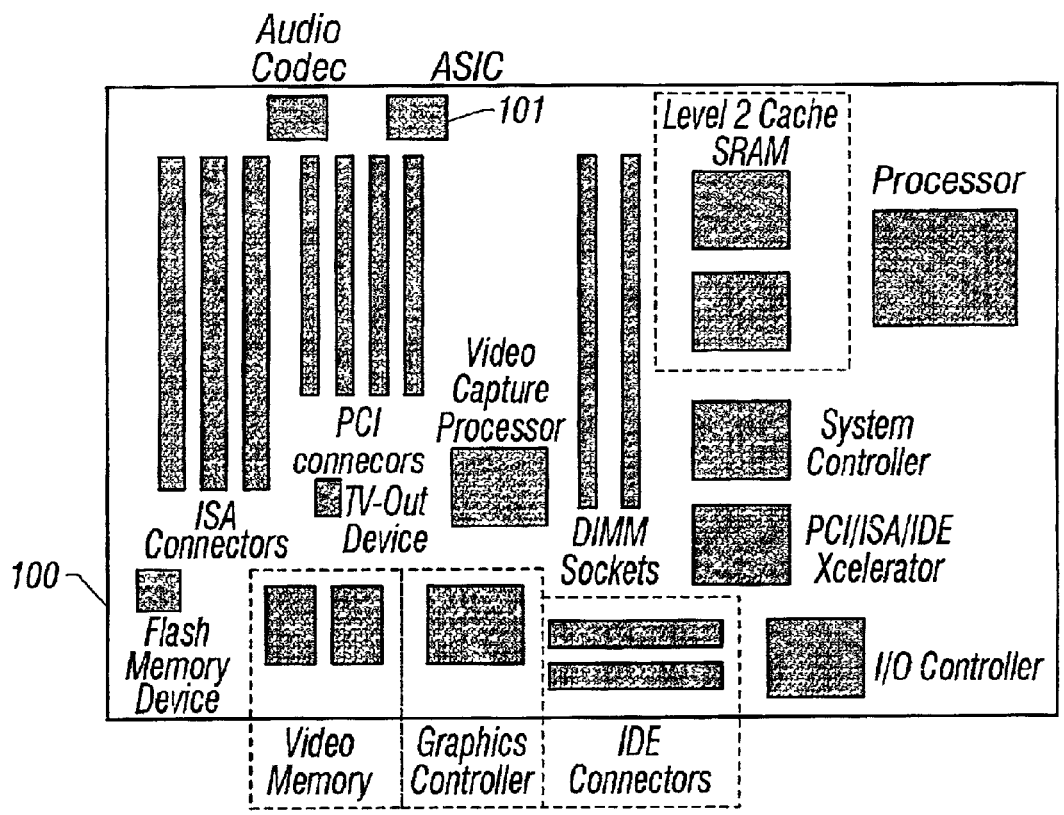
FIG. 1 is a graphical representation of one form of electronic equipment (in the case of FIG. 1, a PC system board) in which the subject invention has significant utility.

Although the invention is susceptible to various modifications and may be exploited in alternative forms, specific embodiments of the invention are shown by way of example in the Drawings and will herein be described in detail. It should be understood, however, that the Drawings and the Detailed Description are not intended to limit the invention to the particular embodiments disclosed, but, conversely, the intention is to embrace all modifications, equivalents, and alternatives falling within the spirit and scope of the present invention, as defined by the appended claims.

DETAILED DESCRIPTION OF THE INVENTION

For a thorough understanding of subject invention, reference may be had to the following Detailed Description, including the appended claims, in connection with the above-described Drawings.

Referring now to FIG. 1, depicted therein is a printed circuit board (PCB) 100 on which may be installed an arrangement of electronic devices that are relevant to the operation of a specific type of electronic equipment. In one application of the invention, the PCB may be the system board, or motherboard, of a personal computer (PC). In this case, the system board would support the installation of a number of integrated circuit devices that typically include, for example, the system processor, system controller, I/O controller, cache memory, video memory, graphics controller, audio codecs and amplifiers, and the like. One or more of these devices may be implemented as an application-specific integrated circuit (ASIC), and a generic ASIC 101 is shown in FIG. 1. Inevitably, a number of connectors will also be mounted on the system board. Typically, among these are ISA connectors, IDE connectors and DIMM sockets. The system board will also include a printed circuit traces that are deposited on, perhaps, both the top and bottom surfaces of the board. The traces are used, inter alia, to interconnect discrete components, pins on the integrated circuit devices and pins on the various connectors, as required. Certain of the traces are used to distribute operating DC voltages, and others may be used to route analog and digital signals. In addition, a substantial portion of both the top and the bottom surfaces of the system board will be occupied by a ground plane and/or a power plane. The use of ground planes and power planes is well understood in the art of electronic circuit design and packaging and serve numerous important purposes, including the provision of stable reference voltages for exchanging analog and digital signals, distribution of power to integrated circuit devices, the mitigation of crosstalk between signals, and the promotion of stability, especially at high frequencies. In addition, the system board will likely exhibit a number of vias that extend through the board thickness and that interconnect selected conductors on one side of the system board with conductors on the opposite side.

As is well known, a number of devices on the system board may draw operating power from the same DC voltage supply, generically referred to herein as B+. Often a conductor trace will meander around the system board, distributing the DC supply voltage as required to various devices. In accordance with judicious design practice, the B+ trace will, at several nodes, be decoupled to ground through a discrete decoupling bypass capacitor. However, although this technique is necessary, and universally utilized, it is, as suggested above, understood that discrete bypass capacitors, because of the series lead and body inductances and series resistances, exhibit diminished effectiveness above certain high frequencies, say 100 MHz. An effect of such parasitic phenomena is to compromise the ability of the discrete capacitor to attenuate noise or EMI.

Although the distribution of spurious (e.g., noise and or EMI) level of high-frequency energy throughout the frequency spectrum above 100 MHz may not itself be a cause of significant concern, it is likely that a significant component of that energy may be concentrated at a specific frequency, $F_o$. In a PC, for example, this frequency might be a harmonic of the system clock signal. Accordingly, a significant performance advantage may be realized by a circuit arrangement that is capable of substantial noise attenuation and/or EMI suppression at a significant frequency, $F_o$. The subject invention affords just such an advantage. Specifically, the inventors here have conceived a simple embellishment to the prevalent discrete bypass capacitor, whereby series resonance is achieved, or at least approached, at $F_o$, so that noise or EMI at $F_o$ may be obviated. The arrangement is depicted in FIGS. 2A and 2B.

Figure 2A:
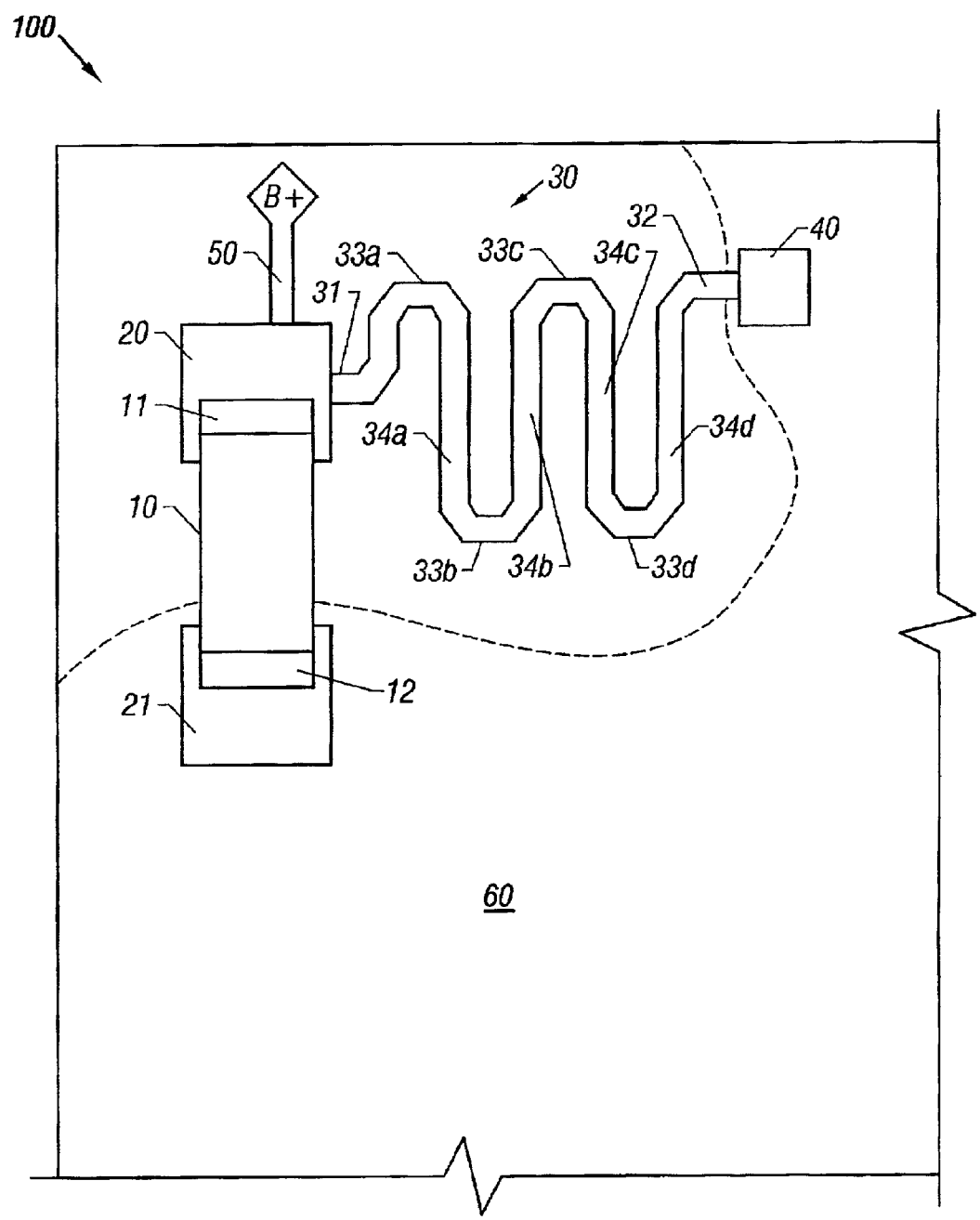
FIGS. 2A and 2B depict the salient components of the invention, a circuit for suppression of spurious high-frequency signals, including a discrete bypass capacitor 10, and an LC network, including an inductor 30 and capacitor 40, both deposited on a printed circuit board.
Figure 2B:
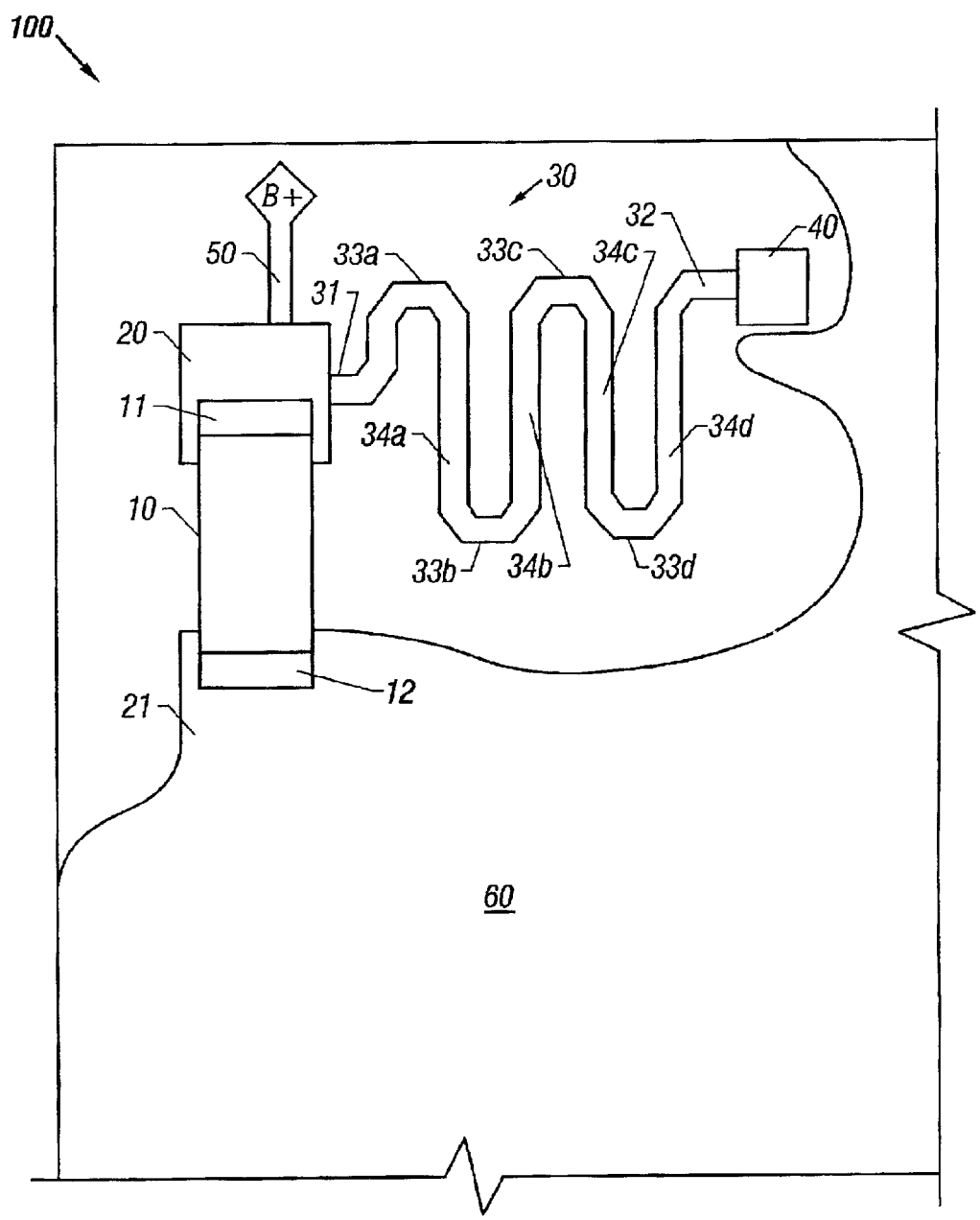

In accordance with circuit arrangements depicted in FIGS. 2A and 2B, a discrete capacitor element 10, which may be, for example, a multilayer ceramic chip capacitor, is connected between a first conductive pad 20 and a second conductive pad 30. That is, a first terminal 11 of capacitor 10 is connected to pad 20, and a second terminal 12 of capacitor 10 is connected to pad 21. Pads 20 and 21 may be deposited on PCB 100 through well-known printed circuit fabrication techniques. In practice, pad 20 may represent a connection node to B+ trace 50, and pad 21 may be connected to the system board ground (GND). Pad 21 may simply be a portion of the GND plane that is deposited on the top surface of PCB 10 or may be connected to a GND plane on the reverse side of PCB 10 through a via (not shown).

Also connected to pad 20, and therefore to B+, is a serpentine conductor 30 that may, as are pads 20 and 21, be printed on the top surface of PCB 100. As may be seen in FIG. 2, serpentine conductor 30 comprises an originating segment 31 connected to pad 20 and a terminating segment 32 coupled to a planar conductor 40. (The relevance of conductor 40 will be revealed below.) Conductor 30 also comprises a number of substantially linear segments 34a, 34b, 34c, and 34d. Liner segment 34a is joined to originating segment 31 by a first turn 33a and is joined to linear segment 34b by a second turn 33b. Linear segment 34b is joined to linear segment 34c by a third turn 33c, and linear segment 34c is joined to linear segment 34d by a fourth turn 33d. The serpentine conductor is terminated, at terminating segment 32, in the substantially rectangular, conductor 40 formed as a planar pad.

With respect to conductor 40, and as may be seen in FIGS. 2A and 2B, conductor 40 is physically and electrically connected to the terminating segment 32 of serpentine conductor 30. Conductor 40 is dimensioned and positioned on PCB so as to, in effect, create a tuning capacitance that combines with the inductance of serpentine conductor 30 to form a series-resonant impedance at a predetermined frequency $F_o$. For example, if a processor clock rate of 133 MHz is hypothesized, then it may be desirable that conductors 30 and 40 resonate at 266 MHz, the second harmonic of the processor clock, and a frequency at which significant spurious energy may be expected to exist on the system board. This choice might presumably represent a judgment that discrete capacitor provides adequate bypass at the fundamental frequency, 133 MHz, and that energy at harmonics greater than the second is less significant.

In an exemplary embodiment, tuning capacitance conductor 40 may be configured in rectangular form, as depicted in FIG. 2. However, those skilled in the art will recognize that tuning capacitance conductor 40 may assume other geometries, including square, circular, triangular, etc. and may adopt an irregular shape. However, in order for conductor 40 to instantiate a capacitance at $F^o$, conductor 40 must subtend an appropriate area on the PCB and must be positioned in some proximity to a second conductor. In the arrangement of FIG. 2, conductor 40 as positioned to be proximate a ground plane 60. In one embodiment (FIG. 2A), conductor 40 may be deposited on the top surface of the PCB, diametrically opposed a ground plane that is deposited on the bottom surface. In this configuration, the tuning capacitance is formed by conductor 40, ground plane 60, and intervening (between conductor 40 and ground plane 60) thickness of the dielectric PCB 100. In an alternative, but perhaps less effective embodiment (FIG. 2B), ground plane 60 may envelop portions of conductor 40 on the top surface of PCB 100. The essence is that conductor 40 is to form one "plate" of a capacitor, and the ground plane on system board forms the second "plate." In this manner, serpentine conductor 30 and conductor 40 effectively form a series LC network, at $F^o$, between pad 20 and GND. Note, however, that there exists no electrical continuity by virtue of LC network between pad 20 and GND.

Figure 3:
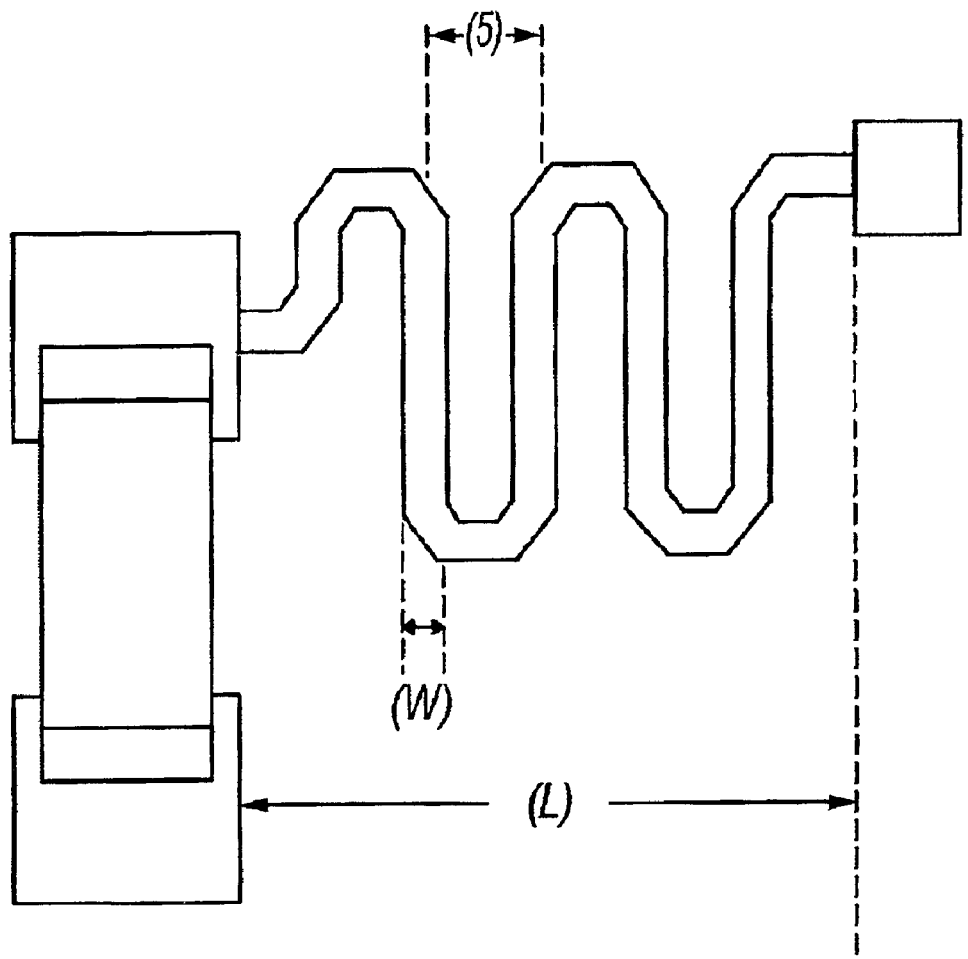
FIG. 3 is a heuristic presentation of the LC network that is useful in acquiring an understanding of geometries that are relevant to the design and operation of the invention.

FIG. 3 is an alternative, heuristic, representation of conductor (inductor) 30 and conductor (tuning capacitor) 40, intended to promote an understanding regarding the manner in which those conductors are to be physically formed in order to afford the desired effect at $F_o$. Specifically, the characteristics of conductor 30 are determined largely through the width (W) of the conductor, the number of turns (N), the spacing (S) between adjacent linear segments, and total linear length (L) between pad 20 and conductor 40. Through the judicious adjustment of these parameters, computer simulation (or empirical investigation) will result in desired attenuation at $F_o$.

For example, in a situation in which 400 MHz noise must be prevented or blocked from appearing at the B+ pin of an ASIC on the system board, where, for example, a discrete 0.01 µf bypass capacitor as deployed, a simulation effort was conducted to determine the corresponding geometries of the printed circuit inductor 30 and printed circuit capacitor conductor 40 to realize series resonance at 400 MHz. In order to trade inductor to resonant at 400 MHz, simulation indicated that a 2.7 inches trace length (L), 5 mils trace width (W), 5 mils trace space (S), and three turns (N). The tuning capacitor was formed as a square, approximately 135 mils×135 mils. When the serpentine trace resonants at 400 MHz, a low impedance path from the discrete capacitor's power pad to the ground plane (under the serpentine trace on the board) is effected, and the 400 MHz noise is substantially attenuated.

As an indication of the results achievable through use of the invention, simulation runs were performed at 400 MHz with the printed LC geometries indicated above. When used with a commercially available 0.001 of discrete capacitor, the impedance at 400 MHz was reduced from 2 ohms to 1 ohm. When used with a commercially available 0.01 of discrete capacitor, the impedance was reduced from 1.4 ohms to 0.9 ohm. In addition, repeated simulation runs verify that the technique is effective and realizable in the context of numerous, if not all, types of discrete capacitors and is applicable to a wide range of frequencies $F_o$. The technique is inherently extensible to use with many kinds of equipments and, in the PC milieu, may be deployed on motherboards, power plane edges, as well as on parochial power planes formed, for example, under the system clock, ASIC and I/O planes.

This technique is sensitive to the characteristics of the circuit board on which it is implemented. Consequently, design of the LC network can be expected to benefit from simulation or empirical determination in which circuit board parameters, such as size, stack up and frequency, are admitted into consideration. Nevertheless, the technique is very effective in the amelioration of high-frequency noise and EMI at a specific frequency. There appears no known method of achieving the desired result. This method is, of course, applicable to system boards used in desktop and workstation computers, as part of cost reduction strategy.

The Detailed Description, insofar as provided above, has elaborated a specific embodiment of the invention in generous detail, so as to enable a skilled artisan to understand and exploit the invention. However, certain ramifications of the invention are worthy of elaboration. In particular, the LC network has been described as including an inductance 30 and a tuning capacitance conductor 40. To be rigorously precise, as distributed circuit elements, there is both a quantum of capacitance associated with conductor 30 and a quantum of inductance associated with conductor 40. However, at a frequency of interest, $F_o$, conductor 30 is predominantly inductive and conductor 40 is predominantly capacitive. In this regard (inductive) conductor 30 is particularly described as having a serpentine geometry. However, the invention comprehends other geometries that, at a predetermined $F_o$, exhibit an inductive impedance. A serpentine conductor results in an inductance at high frequencies, in large part, because of the directional changes necessarily imparted to the current flowing through it. Similarly (capacitive) conductor 40 invites other geometries as well, and a rectangular perimeter is propounded largely for simplicity and regularity. Those skilled in the art realize that the resulting capacitance of conductor 40 is largely dependent on the area subtended by the conductor, the thickness of the PCB 101, and its dielectric properties.

In addition, the LC network has been characterized as series resonant at the predetermined frequency, $F_o$. It may be helpful to understand that, in some circumstances, conductors 30 and 40, when segregated from the remainder of the circuit arrangement, are, in fact, series resonant at a frequency that is only approximate to $F_o$. However, those skilled in the art appreciate that the entire arrangement, which includes capacitor 10, pads 20 and 21, conductors 30 and 40, and ground plane 60, nevertheless effects substantial attenuation at $F_o$; although, because of tolerances associated with, inter alia, printed circuit manufacturing techniques, exactly maximum attenuation will in some instances occur at a frequency slightly displaced from the nominal $F_o$.

Accordingly, although the invention has been described with respect to the specific exemplary embodiment set forth above, the invention is not properly limited to the exemplary embodiment. Various modifications, improvements, and additions may be implemented by those with skill in the art, and such modifications, improvements and additions are to be considered within the scope of the claims.

What is claimed is:

1. A circuit board having a power supply and a ground, tile circuit board comprising:
    a first conductive pad interfaced with the power supply of the circuit board;
    a second conductive pad interfaced with the ground of the circuit board;
    a capacitive element connected between the first and the second conductive pads;
    a serpentine conductor deposited on the circuit board and having first and second ends, the first end connected to the first pad;
    a tuning capacitance coupled to the second end of the serpentine conductor, the serpentine conductor terminating at the tuning capacitance.

2. A circuit board as defined in claim 1, wherein the serpentine conductor is formed from a conductor that is printed on the circuit board.

3. A circuit board as defined in claim 2, wherein tuning capacitance is planar in form.

4. A circuit board as defined in claim 3, wherein the tuning capacitance is printed on the circuit board.

5. A circuit board as defined in claim 1, wherein the serpentine conductor comprises:
    a plurality of substantially linear segments;
    an originating segment coupling a first linear segment to the first pad;
    a terminating segment coupling a second linear segment to the capacitance; and
    a turn coupling two adjacent linear segments.

6. A circuit board as defined in clam 1, wherein serpentine conductor comprises:
    an originating segment;
    an ending segment;
    at least one intermediate linear segment;
    a first turn coupling the originating segment to the at least one intermediate linear segment; and
    a second turn coupling the at least one intermediate linear segment to the ending linear segment.

7. A circuit board as defined in claim 6, wherein the serpentine conductor has a length (L) and a width (W) and wherein the respective lengths of the turns establishes a space (S) between adjacent linear segment and wherein the number of turns is equal to N, and wherein S, L, W and N are chosen so that the serpentine conductor is at least approximately series resonant with the tuning capacitance at a significant frequency $F_o$.

8. A circuit board as defined in claim 7, wherein the tuning capacitance is substantially rectangular.

9. A circuit board as defined in claim 8, wherein the linear segments are respectively mutually parallel.

10. A computer system comprising:
    a printed circuit board;
    at least one integrated circuit device mounted on the printed circuit board, the integrated circuit device having a significant frequency, $F_o$;
    an active conductor coupled to the integrated circuit device;
    a reference conductor coupled to the integrated circuit device;
    a first pad coupled to the active conductor;
    a second pad coupled to the reference conductor;
    a capacitor having first and second ends, the first end connected to the first pad and the second end connected to the second pad; and means coupled to the capacitor for attenuating signals at $F_o$, the means comprising a serpentine conductor and a tuning capacitance, the serpentine conductor and tuning capacitance deposited on the printed circuit board.

11. A computer system as defined in claim 10, wherein the reference conductor provides a ground potential to the integrated circuit device.

12. A computer system as defined in claim 11, wherein the active conductor supplies an operating voltage to the integrated circuit device.

13. A computer system as defined in claim 11, wherein the active conductor supplies an operating signal to the integrated circuit device.

14. A computer system as defined in claim 10, wherein tuning capacitance is printed on the circuit board in the form of a substantially rectangular plane.

15. A computer system as defined in claim 14, wherein the tuning capacitance is coupled to the reference conductor.

16. A computer system as defined in claim 14, wherein the serpentine conductor is printed on the printed circuit board.

17. A circuit board as defined in claim 14, wherein the serpentine conductor comprises:

a plurality of substantially linear segments;

an originating segment coupling a first linear segment to the first pad;

a terminating segment coupling a second linear segment to the capacitance; and a turn coupling two adjacent linear segment.

18. A circuit board as defined in claim 17, wherein serpentine conductor comprises:

at least one intermediate linear segment; and plural turns comprising:

a first turn coupling the originating segment to the first linear segment;

a second turn coupling the first linear segment to an intermediate linear segment; and a third turn coupling an intermediate linear segment to the second linear segment.

19. A circuit board as defined in claim 18, wherein the serpentine conductor has a length (L) and a width (W) and the respective lengths of the turns establishes the space (S) between adjacent linear segments and wherein the number of turns is equal to N, and wherein S, L, W and N are chosen so that the serpentine conductor is at least approximately series resonant with the capacitance at a significant frequency $F_o$.

20. A computer system ms defined in claim 19, wherein the linear segments are respectively mutually parallel.

21. A method of enabling the suppression of spurious signals in electronic equipment, the method comprising:

attaching a discrete capacitor to a printed circuit board (PCB), the discrete capacitor connected at a first end to a power pad and connected at a second end to a reference pad;

depositing an inductance on the PCB so that the inductance is connected at a first end to the power pad;

forming a tuning capacitance on the PCB so that the tuning capacitance is connected to a second end of the inductance; and causing the inductance and tuning capacitance to be dimensioned so that the inductance and tuning capacitance are substantially series resonant at a predetermined frequency, $F_o$.

22. A method as defined in claim 21, wherein the inductance is deposited to form:

a plurality of substantially linear segments;

an originating segment coupling a first linear segment to the first pad;

a terminating segment coupling a second linear segment to the capacitance; and a turn coupling two adjacent linear segments.

23. A method as defined in claim 22, wherein the inductance is deposited to form:

at least one intermediate linear segment; and plural turns comprising:

a first turn coupling the originating segment to the first linear segment;

a second turn coupling the first linear segment to an intermediate linear segment; and a third turn coupling an intermediate linear segment to the second linear segment.

24. A method as defined in claim 23, wherein the inductance is deposited in a manner so that:

(i) the inductance has a length (L) and a width (W);

(ii) respective lengths of the turns establishes a space (S) between adjacent linear segments;

(iii) the number of turns is equal to (N); and (iv) S, L, W, S and N establish a magnitude of the inductance such that the inductance is at least approximately series resonant with the tuning capacitance at $F_o$.

25. A method as defined in claim 24, wherein the inductance is deposited in a manner so that:

(i) the inductance has a length (L) and a width (W);

(ii) respective lengths of the turns establishes a space (S) between adjacent linear traces;

(iii) the number of turns is equal to (N); and (iv) S, L, W, S and N establish a magnitude of the inductance such that the inductance is at least approximately series resonant with the tuning capacitance at $F_o$.

26. A method as defined in claim 22, wherein the tuning capacitance is formed by depositing a planar conductor on a first surface of the PCB and positioning the planar conductor in proximity with a ground plane.

27. A method as defined in claim 26, wherein the inductance is deposited to form:

at least one intermediate linear segment; and a first turn coupling the originating segment to the first linear segment;

a second turn coupling the first linear segment to an intermediate linear segment;

a third turn coupling an intermediate linear segment to the second linear segment.

28. In an electronic equipment, a circuit for attenuating spurious signals at high frequencies, the circuit comprising:

a power pad;

a reference pad;

a discrete capacitor having first and second ends, the first end connected to the power pad and the second end connected to the reference pad;

a ground plane; and a printed circuit LC network connected to the power pad and coupled to the ground plane, and resonant at a predetermined frequency of a spurious signal, the LC network comprising:

a capacitive element;

a plurality of substantially linear segments;
an originating segment coupling a first linear segment to the power pad;
a terminating segment coupling a second linear segment to the capacitive element; and
a turn coupling two adjacent linear segments.

29. A circuit as defined in claim 28, wherein the LC network further comprises:

at least one intermediate linear segment; and plural turns comprising:

a first turn coupling the originating segment to the first linear segment;

a second turn coupling the first linear segment to an intermediate linear segment; and a third turn coupling an intermediate linear segment to the second linear segment.

30. A circuit as defined in claim 28, wherein the capacitive element is formed by affixing a planar conductor on a first surface of a printed circuit board in proximity with the ground plane.

31. A circuit as defined in claim 30, wherein the ground planes is affixed to a second surface of the printed circuit board.

32. A circuit as defined in claim 30, wherein the LC network further comprises:

at least one intermediate linear segment; and plural turns comprising:

a first turn coupling the originating segment to the first linear segment;

a second turn coupling the first linear segment to an intermediate linear segment; and a third turn coupling an intermediate linear segment to the second linear segment.

33. A circuit as defined in claim 32, wherein the linear segments are mutually substantially parallel.

34. A circuit as defined in claim 32, wherein the printed circuit LC network comprises a number, N, substantially linear segments, each having a width, W, and mutually-spaced from an adjacent linear segment by a distance, S, where N, W and S are chosen to form an inductance that in combination with the capacitive element and the discrete capacitor effects substantial attenuation at the predetermined frequency.

35. In an electronic equipment, a circuit module comprising:

a printed circuit board having a top surface and a bottom surface; the printed circuit board formed from a dielectric material having a thickness;

a first conductive pad deposited on a surface of the printed curcuit board;

a second conductive pad deposited on a surface of the printed curcuit board;

a ground plane;

a capacitor coupled between the first and the second conductive pads; and means, including an inductance and a capacitance, coupled to the first pad for suppressing spurious signals at a predetermined frequency, the capacitance formed by a conductor deposited on a surface of the printed circuit board and separated from the ground plane by the printed circuit board to have a predetermined tuning capacitance set by the printed circuit board dielectric thickness.

36. A circuit module as defined in claim 35, wherein the means consists essentially of a conductive trace disposed on the printed circuit board.

37. A circuit module as defined in claim 35, wherein the means comprises:

a plurality of substantially linear segments;

an originating segment coupling a first linear segment to the first pad;

a terminating segment coupling a second linear segment to the capacitance; and a turn coupling two adjacent linear segments.

38. A circuit module as defined in claim 37, wherein the means comprises:

at least one intermediate linear segment;

a first turn coupling the originating segment to the first linear segment;

a second turn coupling the first linear segment to an intermediate linear segment; and a third turn coupling an intermediate linear segment to the second linear segment.

* * * * *